(12) United States Patent
Miyamoto

(10) Patent No.: US 7,821,868 B2
(45) Date of Patent: *Oct. 26, 2010

(54) MEMORY AND CONTROL UNIT

(76) Inventor: Hideaki Miyamoto, 310-20, Arakawa-cho, Ogaki-Shi, Gifu (JP) 503-0993

( * ) Notice: Subject to any disclaimer, the term of this patent is extended or adjusted under 35 U.S.C. 154(b) by 0 days.

This patent is subject to a terminal disclaimer.

(21) Appl. No.: 12/396,243

(22) Filed: Mar. 2, 2009

(65) Prior Publication Data

US 2009/0231929 A1    Sep. 17, 2009

Related U.S. Application Data

(63) Continuation of application No. 11/762,566, filed on Jun. 13, 2007, now Pat. No. 7,518,944.

(30) Foreign Application Priority Data

Jun. 16, 2006   (JP)   ............... 2006-166768
Oct. 20, 2006   (JP)   ............... 2006-285959

(51) Int. Cl.
*G11C 8/00* (2006.01)

(52) U.S. Cl. ............ 365/230.06; 365/189.05; 365/230.08

(58) Field of Classification Search ............ 365/230.06, 365/189.05, 230.08, 185.04; 711/111–114
See application file for complete search history.

(56) References Cited

U.S. PATENT DOCUMENTS

| | | | |
|---|---|---|---|
| 4,829,484 A | 5/1989 | Arimoto et al. | |
| 5,267,097 A * | 11/1993 | Ogino et al. | ............ 360/49 |
| 5,881,010 A | 3/1999 | Artieri | |
| 5,986,914 A | 11/1999 | McClure | |
| 6,414,894 B2 * | 7/2002 | Ooishi et al. | ............ 365/222 |
| 6,646,944 B2 | 11/2003 | Shimano et al. | |
| 6,868,027 B2 | 3/2005 | Kawaguchi | |
| 6,898,108 B2 | 5/2005 | Kato et al. | |
| 6,901,479 B2 | 5/2005 | Tomita | |
| 7,055,001 B2 | 5/2006 | Miura | |
| 7,245,545 B2 | 7/2007 | Miyamoto | |
| 7,518,944 B2 * | 4/2009 | Miyamoto | ............ 365/230.06 |

(Continued)

FOREIGN PATENT DOCUMENTS

JP       63-247997       10/1988

(Continued)

OTHER PUBLICATIONS

Japanese Office Action, JP 2006-285959, Jan. 13, 2009, Japan.

(Continued)

*Primary Examiner*—Gene N. Auduong
(74) *Attorney, Agent, or Firm*—Schwabe, Williamson & Wyatt, P.C.

(57) ABSTRACT

A memory includes a first holding circuit holding a first address of first data, a second holding circuit holding at least one of a second address of the first data and the amount of the first data, and an operation control circuit performing an operation rewriting the first address, an operation rewriting the second address or the amount of the first data and an operation continuously holding the first address and the second address or the amount of the first data.

30 Claims, 5 Drawing Sheets

U.S. PATENT DOCUMENTS

| | | |
|---|---|---|
| 2003/0028745 A1 | 2/2003 | Hosoi |
| 2003/0086312 A1 | 5/2003 | Kang |
| 2005/0141258 A1 | 6/2005 | Kang et al. |
| 2005/0207203 A1 | 9/2005 | Kang |
| 2005/0213419 A1 | 9/2005 | Miyamoto |
| 2008/0181022 A1 | 7/2008 | Fujisawa et al. |

FOREIGN PATENT DOCUMENTS

| | | |
|---|---|---|
| JP | 02-231621 A | 9/1990 |
| JP | 04-358243 A | 12/1992 |
| JP | 05-046359 | 2/1993 |
| JP | 70-73682 | 3/1995 |
| JP | 30-63716 U | 8/1999 |
| JP | 11-272444 | 10/1999 |
| JP | 2000-105991 | 4/2000 |
| JP | 2001-229674 | 8/2001 |
| JP | 2002-344905 A | 11/2002 |
| JP | 2002-369124 A | 12/2002 |
| JP | 2003-123470 | 4/2003 |
| JP | 2004-199842 | 7/2004 |
| JP | 2005078756 A | 3/2005 |
| JP | 2005-115720 | 4/2005 |
| JP | 2006-092640 | 4/2006 |
| JP | 2003-123466 | 5/2010 |
| WO | 02/11138 | 2/2002 |

OTHER PUBLICATIONS

Japanese Office Action, JP 2006-285959, May 13, 2008, Japan.
Notice of Allowability, U.S. Appl. No. 11/762,566, mailed on Oct. 31, 2008.
Office Action mailed Aug. 5, 2008 in U.S. Appl. No. 11/739,336.
Notice of Allowance mailed Jan. 22, 2009 in U.S. Appl. No. 11/739,336.
Office Action mailed Sep. 11, 2009 in U.S. Appl. No. 11/739,336.
Notice of Allowance mailed Jan. 27, 2010 in U.S. Appl. No. 11/739,336.
Notice of Allowance mailed Mar. 16, 2009 in U.S. Appl. No. 11/760,383.
Notice of Allowance mailed Aug. 12, 2008 in U.S. Appl. No. 11/762,566.
Office Action mailed Apr. 1, 2008 in Japanese Patent Application No. 2006-250483.
Office Action, mailed Jun. 6, 2010, for JP Patent Application 2007-109364, 6 pages.

* cited by examiner

IN STOP

MEMORY AND CONTROL UNIT

CROSS-REFERENCE TO RELATED APPLICATIONS

The present application is a continuation of and claims the benefit under 35 U.S.C. §120 to U.S. patent application Ser. No. 11/762,566, entitled "MEMORY AND CONTROL UNIT," filed Jun. 13, 2007, assigned to the same assignee as the present application, and which is incorporated herein by reference in its entirety.

The priority application numbers JP2006-166768, Memory, Jun. 16, 2006, Hideaki Miyamoto and JP2006-285959, Memory and Control Unit, Oct. 20, 2006, Hideaki Miyamoto, upon which this patent application is based are hereby incorporated by reference.

BACKGROUND OF THE INVENTION

1. Field of the Invention

The present invention relates to a memory and a control unit.

2. Description of the Background Art

Generally, a user has demanded to reproduce music or image consecutively from a portion, at which previous reproduction has performed, in a power-up state, in an optical disk unit for reproducing music or image recorded in a CD, a DVD or the like. As a method for achieving such a demand, there is proposed a method of storing information showing the contents of a volatile memory holding data (data read from an optical disk and decoded) used in a subsequent power-up state and an internal state of a central processing unit such as a microcomputer in a nonvolatile memory in a power-down state before terminating the power-down state.

In the conventional method holding the data used in the subsequent power-up state in the power-down state, however, there are required an operation for reading the contents of the volatile memory once in the power-down state with the microcomputer and thereafter writing the same in the nonvolatile memory and an operation for writing the information showing the internal state of the microcomputer in the nonvolatile memory. Thus, control of the microcomputer is disadvantageously complicated.

SUMMARY OF THE INVENTION

A memory according to a first aspect of the present invention comprises a nonvolatile memory cell array including a plurality of nonvolatile memory cells successively storing data, a first holding circuit holding a first address which is a top address of a memory region storing first data of the nonvolatile memory cell array, a second holding circuit holding at least one of a second address which is an end address of the memory region storing the first data of the nonvolatile memory cell array and the amount of the first data and an operation control circuit performing an operation rewriting the first address stored in the first holding circuit, an operation rewriting the second address stored in the second holding circuit or the amount of the first data and an operation continuously holding the first address stored in the first holding circuit and the second address stored in the second holding circuit or the amount of the first data on the basis of a control signal controlling the nonvolatile memory cell array.

A control unit according to a second aspect of the present invention comprises a decode circuit decoding data read from an optical disk, a memory including a nonvolatile memory cell array including a plurality of nonvolatile memory cells successively storing data decoded with the decode circuit, a first holding circuit holding a first address which is a top address of a memory region storing first data which is the data decoded with the decode circuit, stored in the nonvolatile memory cell array, a second holding circuit holding a second address which is an end address of the memory region storing the first data of the nonvolatile memory cell array or the amount of the first data, and an operation control circuit performing an operation rewriting the first address stored in the first holding circuit, an operation rewriting the second address stored in the second holding circuit or the amount of the first data and an operation continuously holding the first address stored in the first holding circuit and the second address stored in the second holding circuit or the amount of the first data on the basis of a control signal controlling the nonvolatile memory cell array, and a control circuit controlling the memory and the decode circuit.

A control unit according to a third aspect of the present invention comprises a decode circuit decoding data transmitted by wireless, a memory including a nonvolatile memory cell array including a plurality of nonvolatile memory cells successively storing data decoded with the decode circuit, a first holding circuit holding a first address which is a top address of a memory region storing first data which is the data decoded with the decode circuit, stored in the nonvolatile memory cell array, a second holding circuit holding a second address which is an end address of the memory region storing the first data of the nonvolatile memory cell array or the amount of the first data, and an operation control circuit performing an operation rewriting the first address stored in the first holding circuit, an operation rewriting the second address stored in the second holding circuit or the amount of the first data and an operation continuously holding the first address stored in the first holding circuit and the second address stored in the second holding circuit or the amount of the first data on the basis of a control signal controlling the nonvolatile memory cell array, and a control circuit controlling the memory and the decode circuit.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
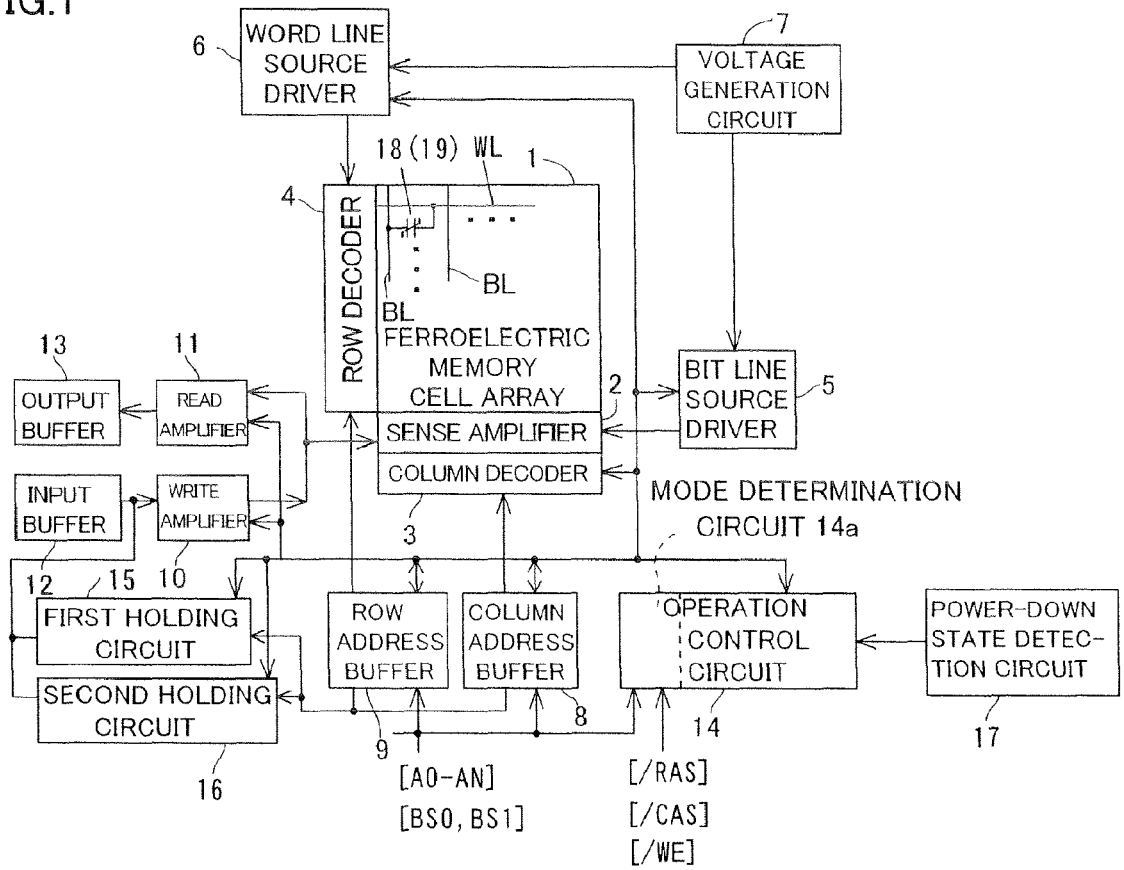
FIG. 1 is a block diagram showing an overall structure of a memory according to a first embodiment of the present invention.

Embodiments of the present invention will be hereinafter described with reference to the drawings.

First Embodiment

A structure of a memory according to a first embodiment of the present invention will be described with reference to FIG. 1.

The memory according to the first embodiment comprises a ferroelectric memory cell array 1, a sense amplifier 2, a column decoder 3, a row decoder 4, a bit line source driver 5, a word line source driver 6, a voltage generation circuit 7, a column address buffer 8, a row address buffer 9, a write amplifier 10, a read amplifier 11, an input buffer 12, an output buffer 13, an operation control circuit 14, a first holding circuit 15 constituted by a latch circuit (not shown) or the like, a second holding circuit 16 constituted by a latch circuit (not shown) or the like and a power-down state detection circuit 17. The ferroelectric memory cell array 1 is an example of the "nonvolatile memory cell array" in the present invention. According to the first embodiment, the operation control circuit 14 includes a mode determination circuit 14a. The mode determination circuit 14a has a function of determining four commands of a bank active command, a read command, a write command and a register set command described later. According to the first embodiment, the first holding circuit 15 holds a first address which is a top address of a memory region storing first data (data decoded from an optical disk, for example) of the ferroelectric memory cell array 1, while the second holding circuit 16 holds a second address which is an end address of the memory region storing the first data of the ferroelectric memory cell array 1.

128 word lines WL and 128 bit lines BL, for example, are arranged on the ferroelectric memory cell array 1 to intersect with each other, while memory cells 19 formed by only single ferroelectric capacitors 18 are arranged on the intersectional positions between the word lines WL and the bit lines BL in the form of a matrix. The ferroelectric capacitors 18 include the corresponding word lines WL, the corresponding bit lines BL and ferroelectric films (not shown) arranged between the word lines WL and the bit lines BL. The row decoder 4 is connected to the word lines WL.

The bit line source driver 5 and the word line source driver 6 are connected to the sense amplifier 2 and the row decoder 4 respectively. Further, the bit line source driver 5 and the word line source driver 6 are supplied with signals having prescribed potentials generated in the voltage generation circuit 7 respectively. The column address buffer 8 and the row address buffer 9 are connected to the column decoder 3 and the row decoder 4 respectively. The write amplifier 10 and the read amplifier 11 are connected to the sense amplifier 2, while the input buffer 12 and the output buffer 13 are connected to the write amplifier 10 and the read amplifier 11 respectively. The operation control circuit 14 is connected to the column decoder 3, the bit line source driver 5, the word line source driver 6, the column address buffer 8, the row address buffer 9, the write amplifier 10 and the read amplifier 11. According to the first embodiment, the first and second holding circuits 15 and 16 are connected to the column address buffer 8, the row address buffer 9, the write amplifier 10, the read amplifier 11 the input buffer 12 and the operation control circuit 14.

According to the first embodiment, three control signals /RAS, /CAS and /WE are input into the operation control circuit 14. Control signals of N+1 address signals (A0 to AN) designating a row address and a column address and bank selection signals (BS0 and BS1) selecting a memory bank of the ferroelectric memory cell array 1 are input into the column address buffer 8, the row address buffer 9 and the operation control circuit 14.

Operations of the memory according to the first embodiment of the present invention will be now described with reference to FIGS. 1 and 2.

Figure 2:
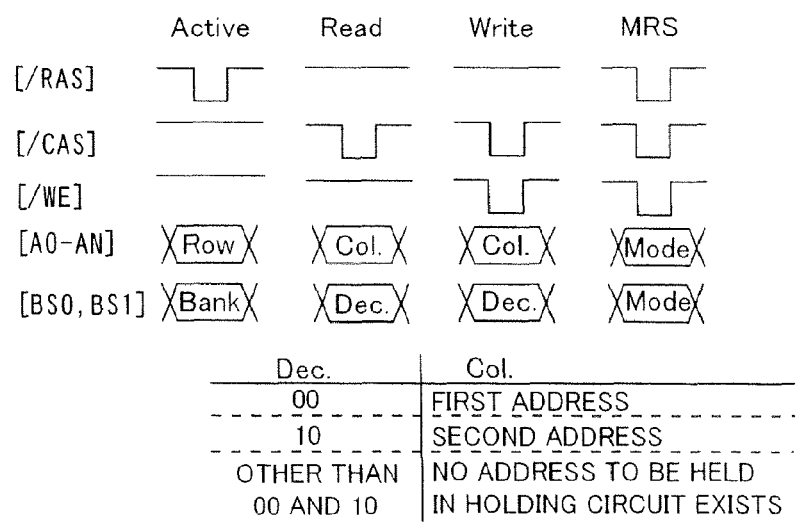
FIG. 2 is a diagram showing input timing of control signals for controlling the memory according to the first embodiment of the present invention.

As shown in FIG. 2, the mode determination circuit 14a shown in FIG. 1 determines either the bank active command (Active), the read command (Read), the write command (Write) or the register set command (MRS) by the combination of an input potentials (high (H) level or low (L) level) of the three control signals (/RAS, /CAS and /WE) and the combination of input potentials (high level or low level) of the bank selection signals BS0 and BS1, and the operation control circuit 14 controls the memory according to this result.

For example, in a case where a BS1 of a low level and a BS0 of a low level are input as the combination of the potentials (high level or low level) input into the bank selection signals (BS0 and BS1) (case where Dec. is 00, shown in FIG. 2) when the read command or the write command is input, the mode determination circuit 14a recognizes that address signals (A0 to AN) input at this moment and an address signal input by the bank active command just before the input of the commands are addresses to be held in the first holding circuit 15. Thus, an address held in the row address buffer 9 by the bank active command and an address held in the column address buffer 8 by the read (or write) command are written and held in the first holding circuit 15. In a case where a BS1 of a high level and a BS0 of a low level are input (case where Dec. is 10, shown in FIG. 2), control of the second address which is the end address of the memory region storing the first data is selected, and the second address is written and held in the second holding circuit 16. Further, in a case where the combination of the BS1 and the BS0 is combination other than the aforementioned combination (the BS1 and the BS0 are at the low level, and the BS1 is at the high level and the BS0 is at the low level) (case where Dec. is other than 00 and 10, shown in FIG. 2), the held address is continuously held without writing in the first holding circuit 15 and the second holding circuit 16. In a case where the power-down state detection circuit 17 detects a power-down state, or the information of the power-down state is transmitted from a microcomputer or a logic circuit (not shown) by a method such as command input or signal input, address information held in the first holding circuit 15 and the second holding circuit 16 is written in the memory cells 19 of the ferroelectric memory cell array 1. Addresses of the memory cells 19 to be written are set to those which can not be accessed from outside (can not be specified by the A0 to the AN). In a case where the number of bits of address information to be written and the number of bits of write data are different from each other, the address information is divided into several pieces and written in the memory cells 19. For example, in a case where the address is 24 bits while the number of bits of the data is 8 bits, the address is divided into three parts, namely 8 bits each, and then written. The operation control circuit 14 controls such that the information of the second address is automatically written subsequent to the write of the information of the first address.

When the microcomputer (logic circuit) (not shown) inputs a command requesting the read of the information of the first and second addresses to the memory as an MRS command (register set command) in turning the power on for example, the operation control circuit 14 successively outputs the information of the first and second addresses from the output buffer 13.

According to the first embodiment, as hereinabove described, the memory comprises the ferroelectric memory cell array 1 including a plurality of the memory cells 19, the first holding circuit 15 holding the first address which is the top address of the memory region storing the first data of the ferroelectric memory cell array 1, the second holding circuit 16 holding the second address which is the end address of the memory region storing the first data of the ferroelectric memory cell array 1, and the operation control circuit 14 controlling rewrite operations of the first holding circuit 15 and the second holding circuit 16, whereby in a case where necessary data in a subsequent power-up state is first data for example, the first data is stored in the nonvolatile ferroelectric memory cell array 1 also after a power-down state and the first and second addresses are written in the memory cells 19 when the power-down state detection circuit 17 detects the power-down state. All operations for entering a subsequent power-up state to be performed in the power-down state with the microcomputer (not shown) are to write the first and second addresses in the memory cells 19, whereby control in the power-down state can be simplified as compared with a conventional method of writing the contents of the volatile memory and the state of the microcomputer in the nonvolatile memory cell array in a power-down state.

Second Embodiment

Figure 3:
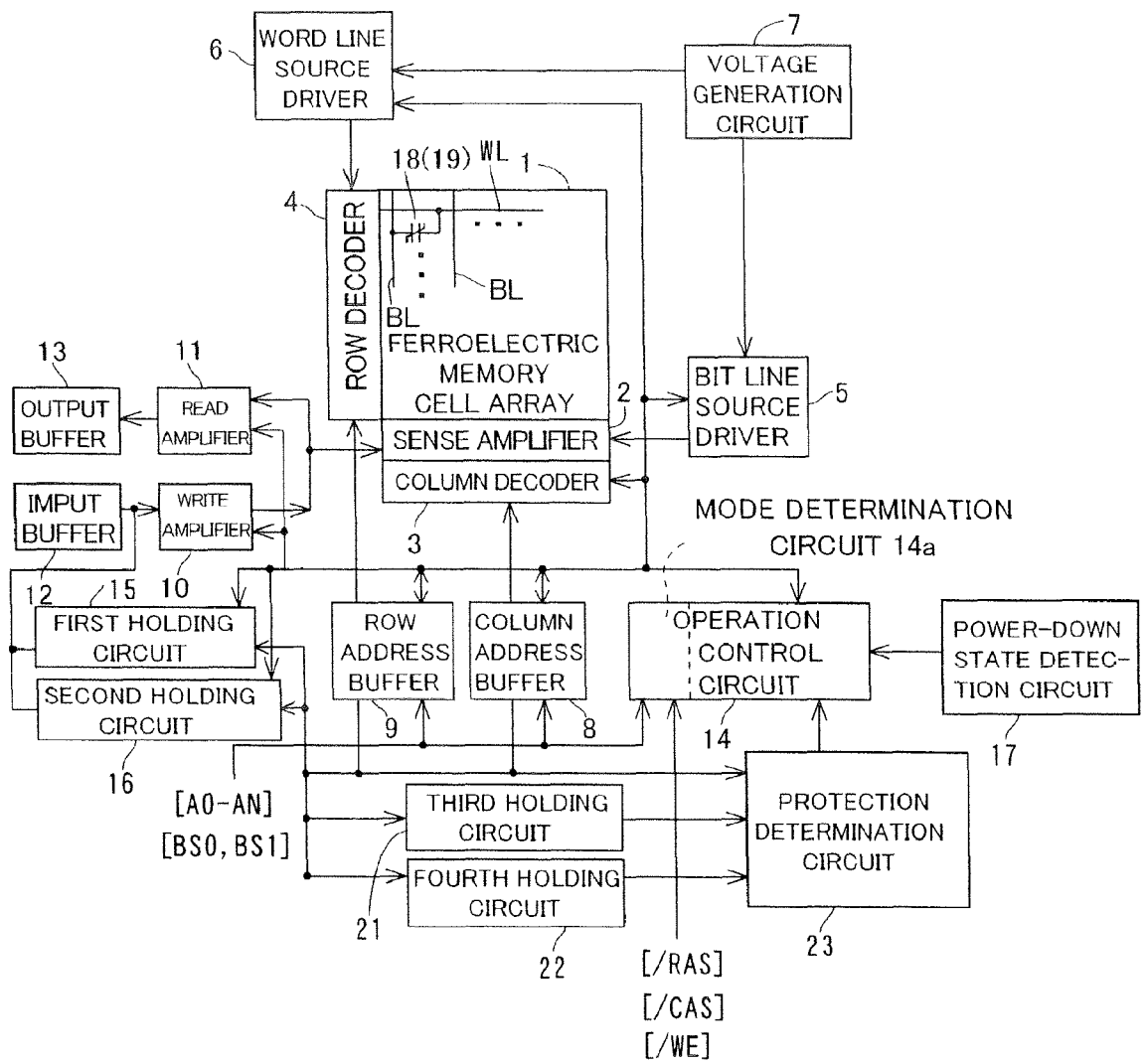
FIG. 3 is a block diagram showing an overall structure of a memory according to a second embodiment of the present invention.

Referring to FIG. 3, a memory according to a second embodiment further comprises a third holding circuit 21 constituted by a latch circuit (not shown) or the like, a fourth holding circuit 22 constituted by a latch circuit (not shown) or the like, and a protection determination circuit 23 dissimilarly to the aforementioned first embodiment.

In the memory according to the second embodiment, the third holding circuit 21 and the fourth holding circuit 22 are connected to a column address buffer 8, a row address buffer 9, a first holding circuit 15, a second holding circuit 16 and the protection determination circuit 23 as shown in FIG. 3. The protection determination circuit 23 is connected to an operation control circuit 14. According to the second embodiment, the third holding circuit 21 holds a third address which is a top address of a memory region storing second data (system information of an optical disk, for example) of a ferroelectric memory cell array 1, while the fourth holding circuit 22 holds a fourth address which is an end address of the memory region storing the second data of the ferroelectric memory cell array 1. The protection determination circuit 23 has a function of controlling write inhibition or write permission to a memory region corresponding to addresses between the third address and the fourth address. The remaining structure of the second embodiment is similar to that of the aforementioned first embodiment.

Operations of the memory according to the second embodiment of the present invention will be now described with reference to FIGS. 2 and 3.

For example, in a case where a mode determination circuit 14a receives a command writing the information of the third address which is the top address of the memory region storing the second data and the fourth address which is the end address of the memory region storing the second data in the memory cells by an MRS command (register set command) shown in FIG. 2, addresses input into the row address buffer 9 and the column address buffer 8 are successively written and held in the third holding circuit 21 and the fourth holding circuit 22 respectively.

In a case where a power-down state detection circuit 17 detects a power-down state, address information held in the first holding circuit 15 and the second holding circuit 16 is written in the memory cells 19 while address information held in the third holding circuit 21 and the fourth holding circuit 22 are also written in the memory cells 19.

The protection determination circuit 23 recognizes the third address held in the third holding circuit 21 and the fourth address held in the fourth holding circuit 22. In a case where a write request occurs by a bank active command (Active) and a write command (Write) shown in FIG. 2, the protection determination circuit 23 determines whether an address to which the write is requested to be performed is within or outside the range of the third address and the fourth address (including the third address and the fourth address). If the address to which the write is requested to be performed is within the range of the third address and the fourth address based on the results of the determination by the protection determination circuit 23, the operation control circuit 14 outputs a control signal so as not to perform the write, while the operation control circuit 14 outputs a control address so as to perform the write if the address to which the write is requested to be performed is not within the range of the third address and the fourth address.

The mode determination circuit 14a resets the third and fourth holding circuits 21 and 22 upon receiving a command resetting the information of the third and fourth addresses by the MRS command (register set command), for example. Thus, the addresses held in the third and fourth holding circuits 21 and 22 are returned to an initial state (zero), whereby the addresses held in the third and fourth holding circuits 21 and 22 are identical to each other. Consequently, it is possible to control so as to allow or prohibit the write in overall regions of the ferroelectric memory cell array 1.

According to the second embodiment, as hereinabove described, the memory comprises the third holding circuit 21 holding the third address which is the top address of the memory region storing the second data of the ferroelectric memory cell array 1, the fourth holding circuit 22 holding the fourth address which is the end address of the memory region storing the second data of the ferroelectric memory cell array 1, and the operation control circuit 14 controls the write prohibition or the write permission to the memory region corresponding to the addresses between the third and fourth addresses, whereby the operation control circuit 14 can control the write inhibition or write permission of the data with respect to the range of arbitrary addresses specified by the third address and the fourth address of the ferroelectric memory cell array 1. Thus, data in the range of the addresses between the third address and the fourth address can be inhibited from being rewritten also in a case where the microcomputer or the logic circuit (not shown) partially goes out of control and performs an unnecessary operation in an unstable state in the power-down state or the power-up state.

The remaining effects of the second embodiment are similar to those of the aforementioned first embodiment.

Third Embodiment

Figure 4:
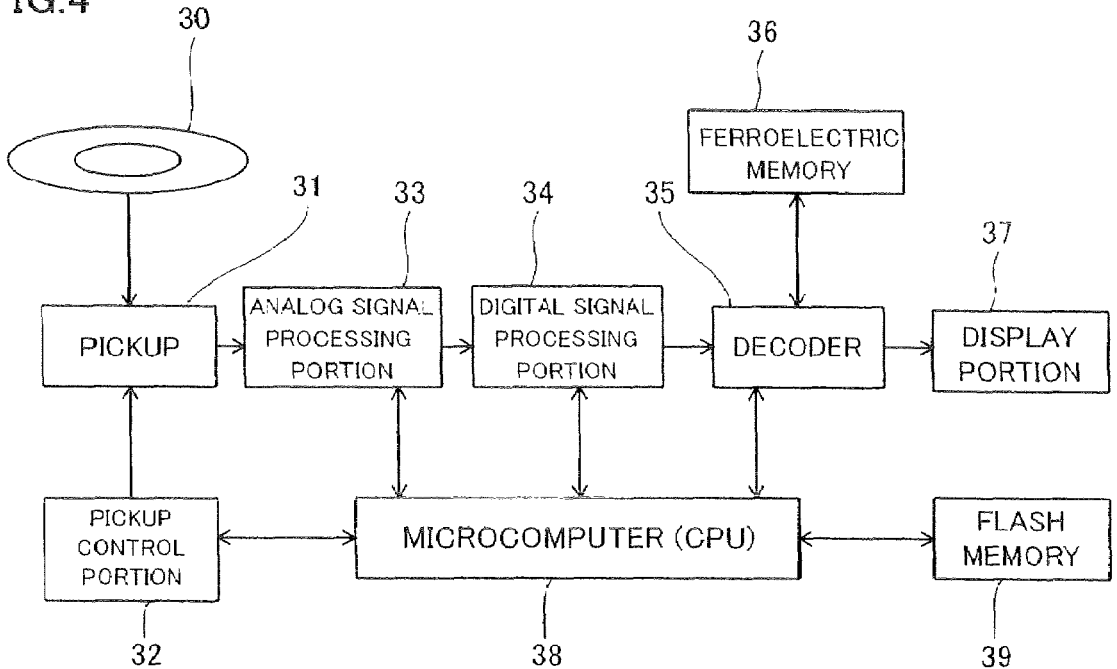
FIG. 4 is a block diagram showing an overall structure of an optical disk reproducer according to a third embodiment of the present invention.

Referring to FIG. 4, a structure of an optical disk reproducer according to a third embodiment, to which the aforementioned memory according to the second embodiment is applied, will be described. According to the third embodiment, the optical disk reproducer is an exemplary control unit.

The optical disk reproducer according to the third embodiment comprises a pickup 31, a pickup control portion 32, an analog signal processing portion 33, a digital signal processing portion 34, a decoder 35, a ferroelectric memory 36, a display portion 37, a microcomputer (CPU) 38 and a flash memory 39, as shown in FIG. 4. The ferroelectric memory 36 is an example of the "memory" in the present invention. The microcomputer 38 is an example of the "control circuit" in the present invention. The optical disk reproducer exchangeably stores an optical disk 30.

The optical disk 30 records compressed reproduction data (first data) such as image which is modulated into data suitable for record. The pickup 31 has a function of retrieving the data recorded in the optical disk 30 as an electrical signal by irradiating the optical disk 30 with laser beam and detecting reflected light of the irradiated laser beam. The pickup control portion 32 has a function of controlling data read from the optical disk 30 by controlling a position of the pickup 31 with respect to the optical disk 30. The analog signal processing portion 33 has a function of generating a prescribed pulse signal based on the change of the electrical signal retrieved by the pickup 31. The digital signal processing portion 34 has a function of generating the compressed reproduction data by modulating the pulse signal generated by the analog signal processing portion 33 and being subjected to an error correction process with respect to the modulated signal.

The decoder 35 has a function of decoding the compressed reproduction data supplied from the digital signal processing portion 34. The decoder 35 further has a function of storing the decoded reproduction data in the ferroelectric memory 36 and outputting the reproduction data stored in the ferroelectric memory 36 to the display portion 37. The decoder 35 further has a function of erasing the reproduction data output to the display portion 37 from the ferroelectric memory 36.

According to the third embodiment, the ferroelectric memory 36, having a plurality of memory cells, has a nonvolatility by constituting the plurality of memory cells by ferroelectric capacitors. Addresses showing positions in the ferroelectric memory 36 are allocated to the plurality of memory cells 36 respectively. The ferroelectric memory 36 is so formed as to store the decoded reproduction data supplied from the decoder 35 in the order of the addresses of the plurality of memory cells.

When the decoder 35 accesses (writes or reads) the ferroelectric memory 36 for decoding the reproduction data, modes (corresponding to Dec. of the first embodiment, shown in FIG. 2) indicating what the access is for (write for buffering data, access for correcting an error, or read for reproduction and display) is put on control signals (bank selection signals BS1 and BS0) and transmitted to the ferroelectric memory 36. Thus, the ferroelectric memory 36 stores the address information (first and second addresses) of the top and end memory cells storing the decoded reproduction data. The error means that the bit of the data is partially inverted in a case where the optical disk 30 has a flaw. The error correction means detection of the error by using a parity bit (bit given to data, in which a code of 0 or 1 indicates whether the number of 1 in given binary digit data is even or odd) and comparing a parity bit given to data with a parity bit obtained by calculation from actual data.

According to the third embodiment, the microcomputer 38 has a function of controlling operations of the pickup control portion 32, the analog signal processing portion 33, the digital signal processing portion 34, the decoder 35 and the flash memory 39. In a case where the power of the optical disk reproducer is turned on to restart (recover) the reproduction of the optical disk 30 and the address information of the top and end memory cells is stored in ferroelectric memory 36, the microcomputer 38 is read from the address information of the top memory cell from the ferroelectric memory 36 and outputs successively from the reproduction data stored in the top memory cell to the display portion 37 by the decoder 35, and read the address information of the end memory cell from the ferroelectric memory 36 to store successively from the continuation of the reproduction data stored in the end memory cell. The flash memory 39 stores a control program for the microcomputer 38.

The microcomputer 38 first reads system information (second data: specific information of the optical disk 30, e.g., what number music data or what number image data is written in which sector in the optical disk 30) of a new optical disk 30 and writes the same in the ferroelectric memory 36, when the new optical disk 30 is reproduced. The microcomputer 38 writes a top address (third address) and an end address (fourth address) showing the range of an address set so as not to be rewritten in the ferroelectric memory 36, such that the system information written in the ferroelectric memory 36 is not overwritten (rewritten) as far as the optical disk 30 is not replaced.

Operations of the optical disk reproducer according to the third embodiment will be now described with reference to FIGS. 4 to 7.

First, when reproduction of the optical disk 30 is started, the microcomputer 38 successively supplies the reproduction data recorded in the optical disk 30 to the decoder 35 through the pickup 31, the analog signal processing portion 33 and the digital signal processing portion 34.

Figure 7:
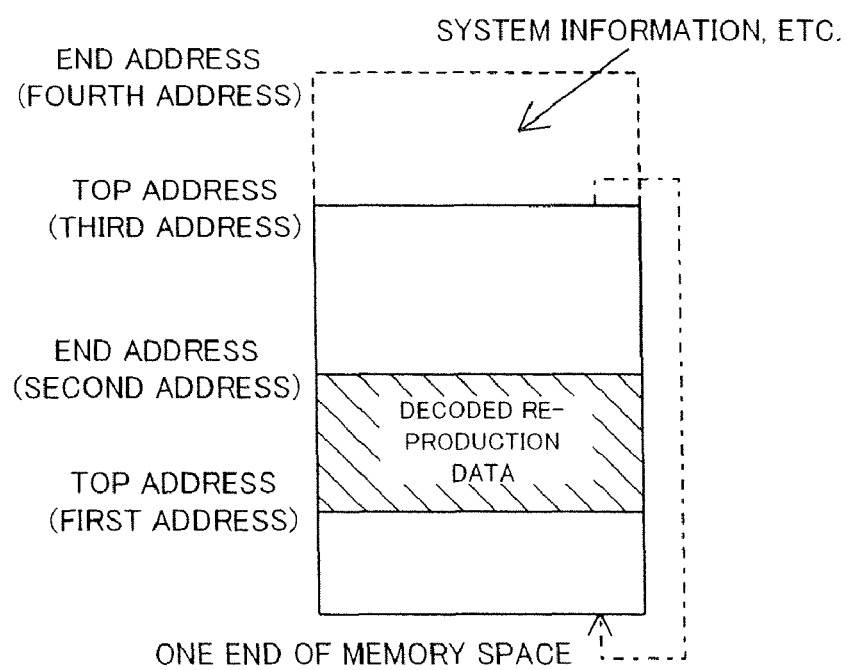

At this time, in a case where the optical disk 30 is reproduced for the first time after the optical disk 30 is replaced, the microcomputer 38 reads the system information of the optical disk 30 and writes the same in the ferroelectric memory 36. As shown in FIG. 7, the range of the addresses (third and fourth addresses) set so as not to perform the rewrite in the ferroelectric memory 36 is written in the ferroelectric memory 36. Thus, it is prohibited to write the decoded data in the addresses between the third and fourth addresses. In a case where the optical disk 30 previously read is reproduced again, read of the system information from the optical disk 30 is not required.

The decoder 35 decodes the compressed reproduction data and stores the decoded reproduction data in the ferroelectric memory 36 in the order of the addresses of the memory cells. Then, the decoder 35 successively outputs the reproduction data stored in the ferroelectric memory 36 to the display portion 37, and erases the output reproduction data from the ferroelectric memory 36.

Thus, the decoded reproduction data is successively written in the ferroelectric memory 36 and the output reproduction data is erased from the ferroelectric memory 36, whereby a region of the decoded reproduction data between the first and second addresses moves from one end of the ferroelectric memory space toward the third address in a case shown in FIG. 7. In a case where the second and third addresses overlap with each other, the second address sets at the one end of the ferroelectric memory space.

According to the third embodiment, when the decoder 35 accesses (writes or reads) the ferroelectric memory 36 for decoding the reproduction data during the reproduction of the optical disk 30, the modes (corresponding to Dec. of the first embodiment, shown in FIG. 2) indicating what the access is for (write for buffering data, access for correcting an error, or read for reproduction and display) are put on control signals (bank selection signals BS1 and BS0) and transmitted to the ferroelectric memory 36, whereby the ferroelectric memory 36 stores the address information of the top and end memory cells storing the decoded reproduction data. According to the third embodiment, the time period of reproducing the data having the bit capacity between the top and end of the reproduction data (memory region in which the decoded reproduction data is stored, shown in FIGS. 5 to 7) is adjusted so as to be longer than the time period required for reading the data from the optical disk 30 and completing the decode of the data.

Figure 5:
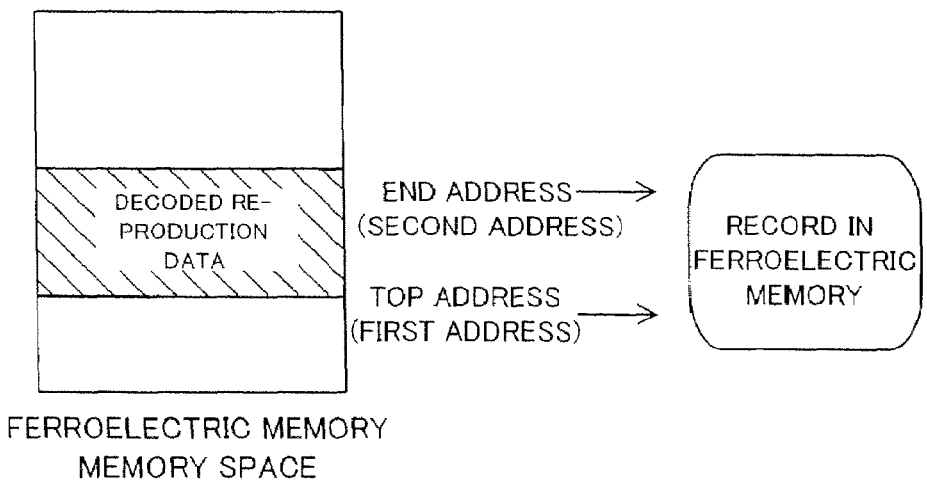
FIGS. 5 to 7 are schematic diagrams showing memory space of a ferroelectric memory of the optical disk reproducer according to the third embodiment shown in FIG. 4.

In a case where the optical disk reproducer is turned off (stopped), the microcomputer 38 stores the address information (first and second addresses) of the top and end memory cells among the memory cells of the ferroelectric memory 36 storing the decoded reproduction data through the decoder 35 in the ferroelectric memory 36, as shown in FIG. 5.

Figure 6:
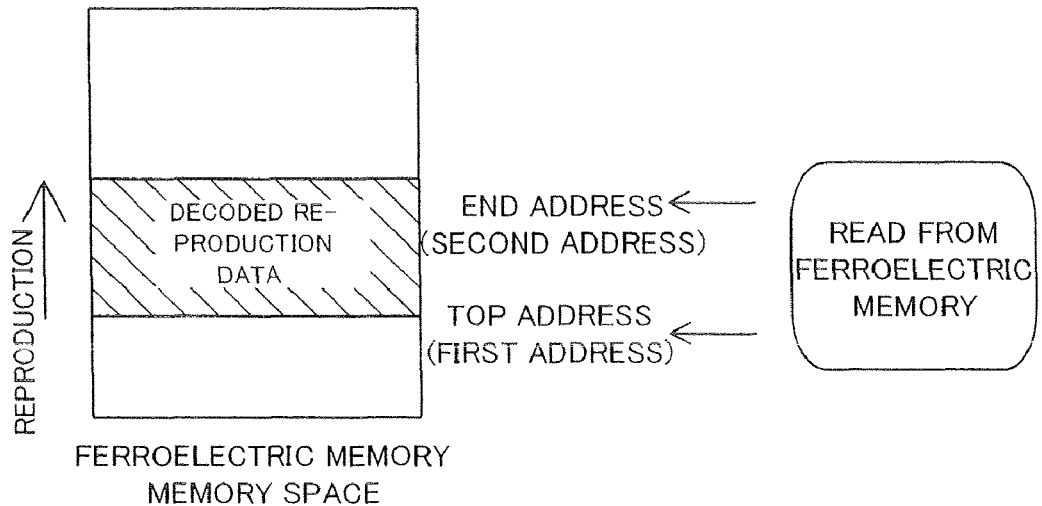

Thereafter, in a case where the optical disk reproducer is turned on to start (recover) the reproduction of the optical disk 30, the microcomputer 38 reads the address information (first address) of the top memory cell stored in the ferroelectric memory 36 and the decoder 35 outputs successively from the reproduction data stored in the top memory cell to the display portion 37 as shown in FIG. 6, thereby performing reproduction and display. In parallel with the reproduction and display, the microcomputer 38 reads the address information (second address) of the end memory cell stored in the ferroelectric memory 36 and the continuous of the reproduction data stored in the end memory cell is read from the optical disk 30. The decoder 35 decodes the read reproduction data and successively stores the same in the ferroelectric memory 36 such that the decoded reproduction data continuously follows the end of the reproduction data at the time of stop.

According to the third embodiment, as hereinabove described, the reproduction data is stored in the ferroelectric memory 36 as the nonvolatile memory, and the top and end addresses of the reproduction data are stored in the ferroelectric memory 36 in a power-down state, whereby the contents of the volatile memory and the state of the microcomputer are not required to be separately written in the nonvolatile memory cells in the power-down state. Thus, control of the microcomputer 38 in the power-down state can be simplified. Additionally, the ferroelectric memory 36 as the nonvolatile memory is used as a memory for decoding the data of the optical disk 30, whereby data is not required to be stored in the power-down state or to be read in the power-up state. Thus, a production recovery speed can be increased after the power-up state.

According to the third embodiment, as hereinabove described, the optical disk reproducer is provided with the nonvolatile ferroelectric memory 36 successively storing the reproduction data decoded by the decoder 35 in the plurality of memory cells, whereby the decoder 35 can output the reproduction data stored in the ferroelectric memory 36 by the decoder 35 before the optical disk reproducer is turned off to the display portion 37 after the optical disk reproducer is turned on to restart the reproduction of the optical disk 30, in a case where the optical disk reproducer is turned on to restart the reproduction of the optical disk 30 after the optical disk reproducer is turned off during the reproduction of the optical disk 30. Thus, the duration of time before restarting the reproduction of the optical disk 30 can be reduced.

According to the third embodiment, as hereinabove described, the system information is written in the range of the addresses (third address and fourth address) set so as not to be rewritten in the ferroelectric memory 36, whereby the system information is not required to be read from the optical disk 30 in a case where the optical disk 30 previously read is reproduced again. Thus, the duration of time before performing the reproduction again can be reduced.

According to the third embodiment, as hereinabove described, the time period required for reproducing the reproduction data storing in the ferroelectric memory 36 as the nonvolatile memory is adjusted to be longer than the time period required for reading the data from the optical disk 30 and completing the decode of the data, whereby new data from the optical disk 30 is decoded during the reproduction data stored in the ferroelectric memory 36 is reproduced after a power-up state. Thus, the reproduction can be continued without interruption after the power-up state.

Fourth Embodiment

Figure 8:
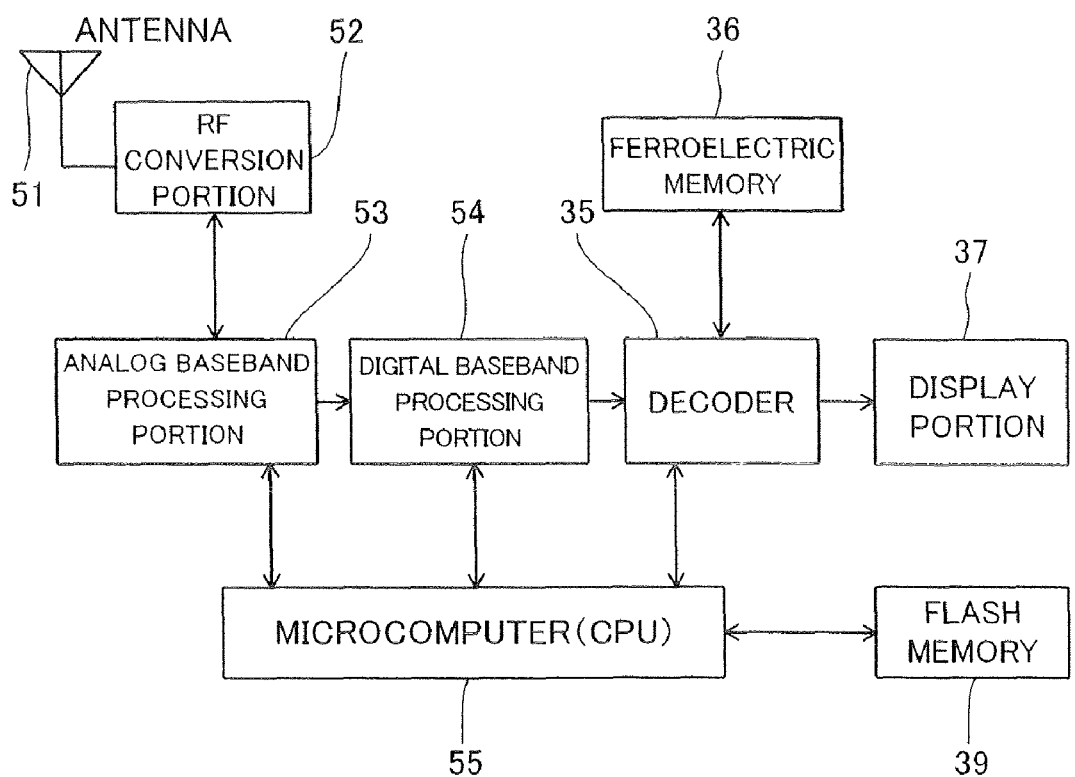
FIG. 8 is a block diagram showing an overall structure of a portable video player according to a fourth embodiment of the present invention.

Referring to FIG. 8, a fourth embodiment of the present invention is applied to a portable video player, which is an exemplary control unit.

A portable video player according to the fourth embodiment comprises an antenna 51, an RF (radio frequency) conversion portion 52, an analog baseband processing portion 53, a digital baseband processing portion 54, a microcomputer (CPU) 55, a decoder 35, a ferroelectric memory 36, a display portion 37 and a flash memory 39, as shown in FIG. 8. The antenna 51 is provided for communicating with a base station unit (not shown). The RF (radio frequency) conversion portion 52 has a function of converting an received signal received from the antenna 51 into an IF (intermediate frequency) signal. The analog baseband processing portion 53 has a function of converting the IF (intermediate frequency) signal converted by the RF conversion portion 52 into an analog baseband signal and converting the analog baseband signal into a digital baseband signal. The digital baseband processing portion 54 has a function of generating reproduction data compressed by the digital baseband signal converted by the analog baseband processing portion 53. The microcomputer (CPU) 55 has a function of controlling operations of the analog baseband processing portion 53, the digital baseband processing portion 54, the decoder 35 and the flash memory 39.

Operations of the portable video player according to the fourth embodiment of the present invention will be now described with reference to FIG. 8.

First, the microcomputer 55 transmits a data delivery request signal to the base station unit (not shown) through the analog baseband processing portion 53 according to information input or selected by a user of the portable video player.

Then, video data (first data) is transmitted from the base station unit (not shown) according to the transmitted data delivery request signal. The video data transmitted from the base station unit (not shown), subjected to an encoding process adding a parity bit for error correction or the like, a digital baseband process, an analog baseband process, an RF conversion process, is transmitted. The antenna 51 receives this video data, which is returned to the original video data by the RF conversion portion 52, the analog baseband processing portion 53, the digital baseband processing portion 54 and the decoder 35.

The digital baseband signal converted by the digital baseband processing portion 54 and input into the decoder 35 is compressed video data similarly to the data input from the digital signal processing portion 34 to the decoder 35 in the aforementioned optical disk reproducer according to the third embodiment shown in FIG. 4. The decoder 35 has a function of storing decoded video data into the ferroelectric memory 36 and outputting the video data stored in the ferroelectric memory 36 to the display portion 37, similarly to the aforementioned third embodiment. The decoder 35 further has a function of erasing the video data outputted to the display portion 37 from the ferroelectric memory 36.

In a case where the video data is reproduced again from the continuation of video data of before turning the portable video player off after turning the portable video player off, the data delivery request signal is transmitted to the base station unit (not shown) in order to transmit the continued video data of before turning the portable video player off from the base station unit (not shown) again.

In a case where the portable video player is turned off (stopped), the microcomputer 55 stores the address information (first and second addresses) of the top and end memory cells among the memory cells of the ferroelectric memory 36 storing the video data decoded through the decoder 35 in the ferroelectric memory 36, similarly to the aforementioned third embodiment.

In a case where the portable video player is turned on to restart (recover) the reproduction of the video data, the microcomputer 55 reads the address information (first address) of the top memory cell stored in the ferroelectric memory 36 and the decoder 35 outputs successively from the video data stored in the top memory cell to the display portion 37, thereby performing reproduction and display, similarly to the aforementioned third embodiment. In parallel with the reproduction and display, the microcomputer 55 reads the address information (second address) of the end memory cell stored in the ferroelectric memory 36 and the data delivery request signal of the data of the continuation of the video data stored in the end memory cell is transmitted to the base station unit (not shown). The decoder 35 decodes the received video data and the decoded video data is successively stored in the ferroelectric memory 36 so as to continuously follow the end of the video data at the time of stop.

According to the fourth embodiment, as hereinabove described, the video data is stored in the ferroelectric memory 36 as the nonvolatile memory and the top and end addresses of the video data are stored in the ferroelectric memory 36 in a power-down state, whereby the video data stored in the ferroelectric memory 36 can be successively reproduced and displayed before turning the portable video player off until the continuation of the video data is received from the base station unit (not shown) in the portable video player and this received video data is written in the ferroelectric memory 36 as reproducible data, when the portable video player is turned on to restart (recover) the reproduction of the video data. Thus, recovery of the reproduction of the portable video player after the power-up state can be performed at a high speed.

The remaining effects of the fourth embodiment are similar to those of the aforementioned third embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the second holding circuit 16 holds the second address which is the end address in the memory region storing the first data in the aforementioned first embodiment, the present invention is not restricted to this but the second holding circuit 16 may alternatively hold the amount of the first data in place of the second address. In this case, the second address which is the end address of the memory region storing the first data can be easily obtained from the first address and the amount of the first data. Alternatively, the second holding circuit 16 may hold both the second address and the amount of the first data.

While the fourth holding circuit 22 holds the fourth address which is the end address of the memory region storing the second data in the aforementioned second embodiment, the present invention is not restricted to this but the fourth holding circuit 22 may alternatively hold the amount of the second data in place of the fourth address. In this case, the fourth address which is the end address of the memory region storing the second data can be easily obtained from the third address and the amount of the second data. Alternatively, the fourth holding circuit 22 may hold both the fourth address and the amount of the second data.

While the microcomputer 38 stores the address information (first and second addresses) of the top and end memory cells among the memory cells of the ferroelectric memory 36 storing the reproduction data decoded through the decoder 35 in the ferroelectric memory 36 in the aforementioned third embodiment, the present invention is not restricted to this but the microcomputer 38 may alternatively store the address information (first address) of the top memory cell among the memory cells of the ferroelectric memory 36 storing the reproduction data decoded through the decoder 35 and the amount of the reproduction data, in place of the second address, in the ferroelectric memory 36. In this case, the second address which is the end address of the memory region storing the reproduction data can be easily obtained from the first address and the amount of the reproduction data. Alternatively, both the second address and the amount of the reproduction data may be stored in the ferroelectric memory 36.

While the microcomputer 55 stores the address information (first and second addresses) of the top and end memory cells among the memory cells of the ferroelectric memory 36 storing the video data decoded through the decoder 35 in the ferroelectric memory 36 in the aforementioned fourth embodiment, the present invention is not restricted to this but the microcomputer 55 may alternatively store the top address information (first address) among the memory cells of the ferroelectric memory 36 storing the video data decoded through the decoder 35 and the amount of the video data in the ferroelectric memory 36. In this case, the second address which is the end address of the memory region storing the video data can be easily obtained from the first address and the amount of the video data. Alternatively, both the second address and the amount of the video data may be stored in the ferroelectric memory 36.

While the decoded reproduction data is stored in one region in the ferroelectric memory 36 and the addresses of the top and end memory cells in the one region are stored in the ferroelectric memory 36 in the aforementioned third embodiment, the present invention is not restricted to this but the decoded reproduction data may be alternatively stored in a plurality of regions in the ferroelectric memory 36 and addresses of the top and end memory cells in the plurality of regions may alternatively stored in the ferroelectric memory 36.

While the addresses of the top and end memory cells are stored in the ferroelectric memory 36 in the aforementioned third embodiment, the present invention is not restricted to this but the addresses of the top and end memory cells may be alternatively stored in an external nonvolatile memory.

While the control program for the microcomputer 38 is stored in the flash memory 39 in the aforementioned third embodiment, the present invention is not restricted to this but the control program for the microcomputer 38 may be alternatively stored in the ferroelectric memory 36. In this case, the flash memory 39 is not required.

What is claimed is:

1. A memory, comprising:
a memory cell array having a plurality of memory cells;
a first holding circuit configured to hold a first address for a first memory region from the memory cell array, wherein the first memory region is configured to store first data;
a second holding circuit configured to hold either or both of an end address for the first memory region or an amount of the first data; and
an operation control circuit coupled to the first and second holding circuits and configured to be responsive to a control signal to perform:
an operation to rewrite the first address held in the first holding circuit; and
an operation to rewrite the end address or the amount of the first data held in the second holding circuit.

2. The memory of claim 1, wherein the operation control circuit is further configured to, if a power-down state is entered, write the first address and write the end address or the amount of the first data.

3. The memory of claim 1, wherein the operation control circuit is further configured to, if a power-up state is entered, write the first address and write the end address or the amount of the first data.

4. The memory of claim 1, wherein the operation control circuit is further configured to, if a stop state is entered, write the first address and write the end address or the amount of the first data.

5. The memory of claim 1, wherein the operation control circuit is further configured to perform an operation to continuously hold the first address in the first holding circuit and to continuously hold the end address or the amount of the first data in the second holding circuit.

6. The memory of claim 5, wherein the operation control circuit is further configured to perform the operation to continuously hold during a power-up state.

7. The memory of claim 1, further comprising:
a third holding circuit configured to hold a top address for a second memory region of the memory cell array, wherein the second memory region is configured to store second data; and
a fourth holding circuit configured to hold an end address for the second memory region or an amount of the second data.

8. The memory of claim 7, further comprising a protection determination circuit configured to determine write inhibition or write permission to a particular memory region of the memory cell array.

9. The memory of claim 8, wherein:
the particular memory region comprises part of the second memory region;
the particular memory region corresponds to an address between the top address held in the third holding circuit and the end address held in the fourth holding circuit; and
the operation control circuit is further configured to control write inhibition and write permission to the second memory region.

10. An apparatus, comprising:
a decode circuit configured to decode input data and output first data;
a nonvolatile memory cell array coupled to the decode circuit and having a plurality of nonvolatile memory cells;
a first holding circuit configured to hold a first address for a first memory region of the nonvolatile memory cell array, wherein the first memory region is configured to store the first data;
a second holding circuit configured to hold either or both of an end address for the first memory region or an amount of the first data; and
an operation control circuit coupled to the first and second holding circuits and configured to be responsive to a control signal to perform:
an operation to rewrite the first address held in the first holding circuit; and
an operation to rewrite the end address or the amount of the first data held in the second holding circuit.

11. The apparatus of claim 10, further comprising an optical disk reproducer, wherein the input data comprises data read from an optical disk.

12. The apparatus of claim 10, further comprising a portable media player, wherein the input data comprises wirelessly transmitted data.

13. The apparatus of claim 12, wherein the wirelessly transmitted data comprises video data.

14. The apparatus of claim 10, wherein the operation control circuit is further configured to, if a power-down state is entered, write the first address and write the end address or the amount of the first data.

15. The apparatus of claim 10, wherein the operation control circuit is further configured to, if a power-up state is entered, write the first address and write the end address or the amount of the first data.

16. The apparatus of claim 10, wherein the operation control circuit is further configured to, if a stop state is entered, write the first address and write the end address or the amount of the first data.

17. The apparatus of claim 10, wherein the operation control circuit is further configured to perform an operation to continuously hold the first address in the first holding circuit and to continuously hold the end address or the amount of the first data in the second holding circuit.

18. The apparatus of claim 17, wherein the operation control circuit is further configured to perform the operation to continuously hold during a power-up state.

19. A method of operating a memory, the method comprising:
storing first data in a first memory region of a memory cell array having a plurality of memory cells;
holding, in a first holding circuit, a first address for the first memory region;
holding, in a second holding circuit, either or both of an end address for the first memory region or an amount of the first data; and
in response to a control signal, rewriting the first address held in the first holding circuit and rewriting the end address or the amount of the first data held in the second holding circuit.

20. The method of claim 19, wherein, if a power-down state is entered, writing the first address and writing the end address or the amount of the first data.

21. The method of claim 19, wherein, if a power-up state is entered, writing the first address and writing the end address or the amount of the first data.

22. The method of claim 19, wherein, if a stop state is entered, writing the first address and writing the end address or the amount of the first data.

23. The method of claim 19, further comprising continuously holding the first address in the first holding circuit and continuously holding the end address or the amount of the first data in the second holding circuit.

24. The method of claim 23, wherein said continuously holding the first address in the first holding circuit and said continuously holding the end address or the amount of the first data in the second holding circuit are performed during a power-up state.

25. The method of 19, further comprising:

storing second data in a second memory region of the memory cell array;

holding, in a third holding circuit, a top address for the second memory region; and holding, in a fourth holding circuit, an end address for the second memory region or an amount of the second data.

26. A memory apparatus, comprising:

first memory region means for storing first data;

first circuit means for holding a first address for the first memory region means;

second circuit means for holding either or both of an end address for the first memory region means or an amount of the first data; and means for rewriting, in response to a control signal, the first address held in the first circuit means and for rewriting the end address or the amount of the first data held in the second circuit means.

27. The apparatus of claim 26, further comprising:

second memory region means for storing second data;

third circuit means for holding a top address for the second memory region means; and fourth circuit means for holding an end address for the second memory region means or an amount of the second data.

28. The apparatus of claim 26, wherein the first memory region means comprises part of a nonvolatile memory cell array.

29. The apparatus of claim 26, wherein the means for rewriting is configured to write the first address and write the end address or the amount of the first data, if a power-down state, a power-up state, or a stop state is entered.

30. The apparatus of claim 26, wherein the first circuit means is configured to continuously hold the first address, and wherein the second circuit means is configured to continuously hold the end address or the amount of the first data in the second holding circuit.

* * * * *